(12) United States Patent
Han et al.

(10) Patent No.: US 8,864,936 B2
(45) Date of Patent: Oct. 21, 2014

(54) APPARATUS AND METHOD FOR PROCESSING SUBSTRATE

(75) Inventors: Young Ki Han, Seoul (KR); Young Soo Seo, Gyeonggi-Do (KR)

(73) Assignee: Charm Engineering Co., Ltd. (KR)

( * ) Notice: Subject to any disclaimer, the term of this patent is extended or adjusted under 35 U.S.C. 154(b) by 440 days.

(21) Appl. No.: 12/810,915

(22) PCT Filed: Dec. 10, 2008

(86) PCT No.: PCT/KR2008/007291
§ 371 (c)(1),
(2), (4) Date: Jun. 28, 2010

(87) PCT Pub. No.: WO2009/084823
PCT Pub. Date: Jul. 9, 2009

(65) Prior Publication Data
US 2010/0288728 A1    Nov. 18, 2010

(30) Foreign Application Priority Data
Dec. 31, 2007   (KR) .......................... 10-2007-0141363

(51) Int. Cl.
C23F 1/00       (2006.01)
H01L 21/306     (2006.01)
C23C 16/00      (2006.01)
H01J 37/20      (2006.01)
H01J 37/32      (2006.01)

(52) U.S. Cl.
CPC ....... *H01J 37/20* (2013.01); *H01J 2237/20235* (2013.01); *H01J 37/32449* (2013.01); *H01J 37/3244* (2013.01); *H01J 2237/2002* (2013.01)
USPC .................. 156/345.43; 118/723 E; 118/729; 156/345.54

(58) Field of Classification Search
USPC ........... 156/345.43–345.47, 345.54; 118/715, 118/722, 723 R, 723 E, 729
See application file for complete search history.

(56) References Cited

U.S. PATENT DOCUMENTS

| | | | | |
|---|---|---|---|---|
| 6,159,299 | A  * | 12/2000 | Koai et al. ..................... | 118/715 |
| 2004/0099635 | A1 * | 5/2004 | Nishikawa ....................... | 216/58 |
| 2005/0173067 | A1 * | 8/2005 | Lim ......................... | 156/345.32 |
| 2006/0237138 | A1 * | 10/2006 | Qin .......................... | 156/345.51 |

FOREIGN PATENT DOCUMENTS

| | | |
|---|---|---|
| JP | 2003-193229 | 7/2003 |
| JP | 2004022821 A | 1/2004 |
| JP | 2006319043 A | 11/2006 |
| JP | 2007035948 A | 2/2007 |

(Continued)

OTHER PUBLICATIONS

Written Opinion of WO2009084823.

*Primary Examiner* — Maureen Gramaglia (57) ABSTRACT

There are provided an apparatus and method for processing a substrate. By using the apparatus and method, plasma processing can be individually performed on each of edge and rear regions of a substrate in a single chamber. The apparatus includes a chamber providing a reaction space; a stage installed in the chamber; a plasma shielding unit installed opposite to the stage in the chamber; a support unit for supporting a substrate between the stage and the plasma shielding unit; a first supply pipe provided at the stage to supply a reaction or non-reaction gas to one surface of the substrate; and second and third supply pipes provided at the plasma shielding unit, the second supply pipe supplying a reaction gas to the other surface of the substrate, the third supply pipe supplying a non-reaction gas to the other surface.

9 Claims, 5 Drawing Sheets

(56) References Cited

FOREIGN PATENT DOCUMENTS

| KR | 20050008637 A | 1/2005 |
| KR | 1020070016585 A | 2/2007 |
| KR | 1020070034811 A | 3/2007 |
| WO | 2004100247 A | 11/2004 |

* cited by examiner

Fig. 7

APPARATUS AND METHOD FOR PROCESSING SUBSTRATE

TECHNICAL FIELD

The present invention relates to an apparatus and method for processing a substrate, and more particularly, to an apparatus and method for processing a substrate, wherein plasma processing can be individually performed on each of edge and rear regions of a substrate in a single chamber.

BACKGROUND ART

A semiconductor device is fabricated by performing thin film deposition and etching processes. That is, a thin film is formed in a predetermined region on a substrate by performing a deposition process, and an unnecessary portion of the thin film is removed by performing an etching process using an etching mask, thereby forming a desired circuit pattern or circuit element on the substrate to fabricate a semiconductor device. Generally, such deposition and etching processes are repeated several times until a desired circuit pattern is obtained.

Meanwhile, in a thin film deposition process, a thin film may be deposited not only in a desired central region of a substrate but also in undesired edge and rear regions of the substrate. In addition, in a thin film etching process, various kinds of residues remaining in an etching device, i.e., particles may also be adsorbed in the edge and rear regions of the substrate. Typically, an electro static chuck for fixing a substrate is used in a stage on which the substrate is mounted. A surface of the electro static chuck facing the substrate may be formed with grooves through which a gas existing between the substrate and the electro static chuck can be evacuated. In addition, the stage may be subjected to an embossing process so that a surface of the stage is embossed. At this time, a thin film and particles may be accumulated on the entire rear of the substrate through the grooves or the gaps between the embossments. If subsequent processes are continuously performed in a state where the thin film and particles accumulated on the substrate are not removed, there may be many problems in that the substrate is bent or the alignment of the substrate may be difficult. Therefore, after the deposition and etching processes of the substrate are finished, the edge and rear regions of the substrate should be respectively etched using an edge etching device and a rear etching device so that the unnecessary thin film and particles are removed.

However, since conventional edge and rear etching devices separately exist as independent devices, a broad installation space has been required. Further, processes have been performed by moving the substrate between several chambers. Therefore, it is highly likely that the substrate subjected to processing is exposed to the atmosphere and contaminated. Further, a standby time is increased due to the movement of the substrate between chambers, and therefore, a processing time may be entirely increased.

DISCLOSURE OF INVENTION

Technical Problem

The present invention is conceived to solve the aforementioned problems. The present invention provides an apparatus and method for processing a substrate, wherein plasma processing can be individually performed on each of edge and rear regions of a substrate in a single chamber without moving of the substrate in a process.

Technical Solution

According to an aspect of the present invention, there is provided an apparatus for processing a substrate, which includes a chamber providing a reaction space; a stage installed in the chamber; a plasma shielding unit installed opposite to the stage in the chamber; a support unit for supporting a substrate between the stage and the plasma shielding unit; a first supply pipe provided at the stage to supply a reaction or non-reaction gas to one surface of the substrate; and second and third supply pipes provided at the plasma shielding unit, the second supply pipe supplying a reaction gas to the other surface of the substrate, the third supply pipe supplying a non-reaction gas to the other surface.

The apparatus may further include a driving unit for lifting at least one of the stage and the plasma shielding unit.

At least one of the stage and the plasma shielding unit may have a protruding portion that protrudes in a direction of the substrate.

The protruding portion may be formed so that a planar area of the protruding portion is smaller than that of the substrate.

The protruding portion may be formed so that a planar diameter of the protruding portion is smaller than an inner diameter of the support unit.

The support may include an arm portion expanded and contracted in the chamber; and a support portion bent inward at an end of the arm portion to support an edge region of the substrate on a top surface thereof.

The arm portion may be installed to an upper or lower side of the chamber.

The support portion may have the bent portion formed to be flat or inclined.

The support portion may be formed in the shape of a single ring, or in the shape of a plurality of segments, into which a single ring is divided.

The reaction gas may be supplied to an edge region of the substrate through the second supply pipe, and the non-reaction gas be supplied to a central region of the substrate through the third supply pipe.

According to another aspect of the present invention, there is provided a method for processing a substrate, which includes disposing a substrate between a stage and a plasma shielding unit; adjusting a gap between the substrate and the plasma shielding unit to be a first gap in a state where the substrate is seated on the stage; supplying a reaction gas to an edge region of the substrate through the plasma shielding unit, thereby performing a primary plasma processing process on the substrate; adjusting the gap between the substrate and the plasma shielding unit to be a second gap in a state where the stage and the substrate are spaced apart from each other; and supplying a reaction gas to a rear region of the substrate through the stage, thereby performing a secondary plasma processing process on the substrate.

The first and second gaps may be adjusted to be a distance allowing plasma not to be activated between a central region of the substrate and the plasma shielding unit, i.e., in a range of 0.1 to 0.7 mm.

The reaction gas may include a fluorine radical or a chlorine radical. The fluorine radical may include at least one of $CF_4$, $CHF_4$, $SF_6$, $C_2F_6$, $C_4F_8$ and $NF_3$. The chlorine radical may include at least one of $BCl_3$ and $Cl_2$.

In performing the primary plasma processing process, a non-reaction gas may be supplied to the central region of the substrate through the plasma shielding unit.

The non-reaction gas may include at least one of oxygen, hydrogen, nitrogen and inert gases.

The substrate may be disposed between the stage and the plasma shielding unit by being supported on a support unit.

The first and second gaps may be adjusted by lifting at least one of the support unit, the stage and the plasma shielding unit.

According to a further aspect of the present invention, there is provided a method for processing a substrate, which includes supporting a substrate on a support unit between a stage and a plasma shielding unit; lifting the substrate through the stage to adjust a gap between the substrate and the plasma shielding unit to be a first gap; supplying a reaction gas to an edge region of the substrate through the plasma shielding unit, thereby performing a primary plasma processing process on the substrate; lifting the substrate through the support unit to adjust the gap between the substrate and the plasma shielding unit to be a second gap; and supplying a reaction gas to a rear region of the substrate through the stage, thereby performing a secondary plasma processing process on the substrate.

The first and second gaps may be set in a range of 0.1 to 0.7 mm.

Advantageous Effects

An apparatus for processing a substrate allows plasma processing to be individually performed on each of edge and rear regions of the substrate in a single chamber in such a manner that the plasma processing on the edge region of the substrate is performed while protecting the central regions of the front and rear of the substrate and the plasma processing on the rear region of the substrate is performed while protecting the front of the substrate. Accordingly, an installation space for the apparatus is reduced, so that the space utility of production lines can be improved. Further, since there is no exposure of the substrate to the atmosphere caused by the movement of the substrate between chambers, the substrate is less contaminated. Also, since there is no standby time caused by the movement of the substrate between the chambers, the entire processing time can be reduced.

BEST MODE FOR CARRYING OUT THE INVENTION

Hereinafter, exemplary embodiments of the present invention will be described in detail with reference to the accompanying drawings.

However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

First Embodiment

Figure 1:
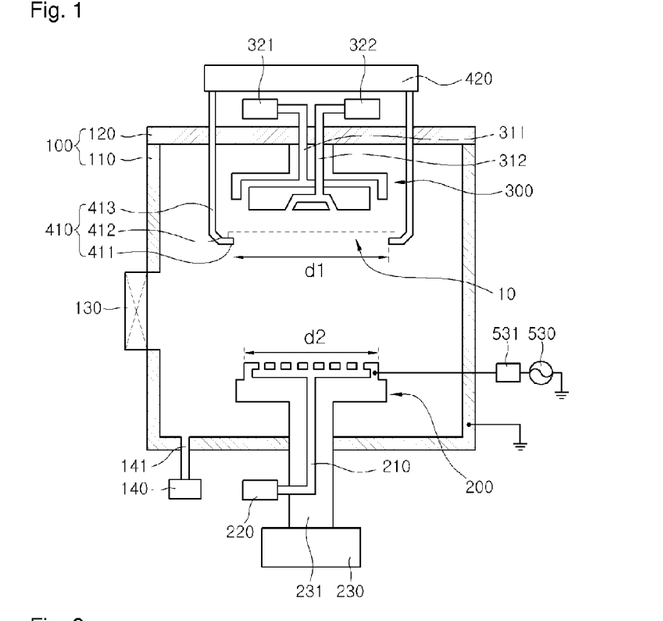
FIG. 1 is a schematic view showing an apparatus for processing a substrate according to a first embodiment of the present invention.
Figure 2:
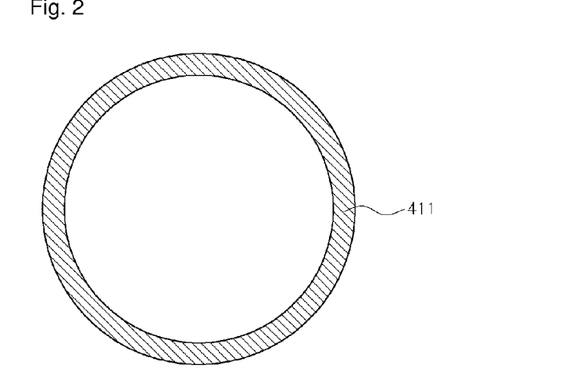
FIGS. 2 and 3 are bottom surfaces of support portions of a support according to the first embodiment of the present invention.
Figure 3:
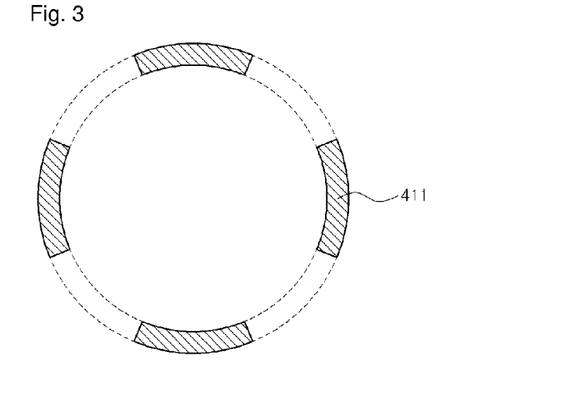

FIG. 1 is a schematic view showing an apparatus for processing a substrate according to a first embodiment of the present invention, and FIGS. 2 and 3 are bottom surfaces of support portions of a support according to the first embodiment of the present invention.

Referring to FIG. 1, the apparatus for processing a substrate according to this embodiment includes: a chamber 100 having a reaction space provided therein; a stage 200 installed at a lower part of the interior of the chamber 100; a plasma shielding unit 300 installed at an upper part of the interior of the chamber 100 opposite to the stage 200; a support unit 410 configured to support a substrate between the stage 200 and the plasma shielding unit 300; and a plasma generating unit 510, 520 and 530 for generating plasma between the stage 200 and the plasma shielding unit 300. Here, the substrate 10 refers to a plate-shaped object to be processed, e.g., a wafer, a glass panel or the like, which is required to be plasma-processed, such as etched, deposited, cleansed, or the like.

The chamber 100 includes a chamber body 110 having a predetermined space provided therein, and a chamber lid 120 for covering a top of the chamber body 110. At this time, the chamber lid 120 is airtightly connected to the top of the chamber body 110 to define a closed reaction space inside of the chamber 100. It will be apparent that the chamber body 110 and the chamber lid 120 may be integrally formed. The chamber 100 is provided with an opening/closing unit for loading and unloading the substrate 10, and an evacuation unit for evacuating a remaining gas. For example, in this embodiment, the opening/closing unit is configured by forming a gate 130 at a sidewall of the chamber 100, and the evacuation unit is configured by forming an evacuation port 141 at a bottom wall of the chamber 100 and connecting an evacuation pump 140 to the evacuation port 141. Preferably, the chamber 100 is configured to be connected to a ground power source so that current does not flow through the chamber 100.

The stage 200 is provided with a protruding portion at the upper center of a body thereof. The protruding portion provides a seating region in which a central portion of a rear of the substrate 10 is seated when an edge of the substrate 10 is etched. The stage 200 is provided with a first supply pipe 210 for supplying a reaction or non-reaction gas to the rear of the substrate 10, wherein one side of the first supply pipe 210 extends to the outside of the chamber 100 and is connected to a first gas supply unit 220. At this time, the other end of the first supply pipe 210, i.e., the end directed to the substrate in a gas injection direction, is formed with a plurality of openings such that the reaction or non-reaction gas supplied from the outside of the chamber 100 is divided into a plurality of streams before the gas is injected to the rear of the substrate 10. Accordingly, the gas can be uniformly injected to the rear of the substrate 10. Preferably, the stage 200 is installed so as to be lifted and rotated by a driving unit. In this embodiment, a lower side of the body of the stage 200 is coupled to one end of a drive shaft 231, and the other end of the drive shaft 231 passes through the bottom wall of the chamber 100 and then is coupled to a first driving unit 230 for applying lifting force and rotating force to the drive shaft 231.

Meanwhile, although not shown, a chuck unit, such as a chuck member using mechanical, electrostatic, vacuum sucking force or the like, for fixing the substrate 10 may be provided at the protruding portion of the stage 200; and a cooling unit, such as a cooling tube and a refrigerant circulating therethrough, for maintaining constant processing temperature in the chamber 100 or a heating unit, such as an electric heater, a lamp heater or the like, may be provided at the body of the stage 200.

The plasma shielding unit 300 is provided with a protruding portion at the lower center of a body thereof. When the rear of the substrate 10 is etched, the protruding portion is positioned adjacent to a central region of the front of the substrate 10, so that it is possible to prevent plasma from flowing into the central region of the front of the substrate 10 and to induce plasma to locally be generated. The plasma shielding unit 300 is provided with a second supply pipe 311 for supplying a reaction gas to an edge region of the front of the substrate 10, and a third supply pipe 312 for supplying a non-reaction gas to the central region of the front of the substrate 10. One side of the second supply pipe 311 extends to the outside of the chamber 100 and is connected to a second gas supply unit 321. One side of the third supply pipe 312 extends to the outside of the chamber 100 and is connected to a third gas supply unit 322. At this time, the other sides of the second and third supply pipes 311 and 312, i.e., the sides directed to the substrate in a gas injection direction, are formed with a plurality of openings such that the gas supplied from the outside of the chamber 100 is divided into a plurality of streams before the gas is injected toward the substrate 10. Accordingly, the gas can be uniformly injected to the edge or central region of the front of the substrate 10.

Meanwhile, the protruding portions of the stage 200 and the plasma shielding unit 300 are preferably formed to have the same shape as the substrate 10 and to have a size slightly smaller than that of the substrate 10. However, the size of the protruding portions may be varied depending on processing conditions. Therefore, even though the rear of the substrate 10 is seated on the protruding portion of the stage 200 or the protruding portion of the plasma shielding unit 300 is positioned close to the front of the substrate 10, the edge region of the substrate 10 is exposed, so that plasma can freely flow into the edge exposed region of the substrate 10, and thus, the exposed edge region of the substrate 10 can be easily etched. At this time, the exposed edge region of the substrate 10 preferably has a width of about 0.1 to 5 mm from the end of the substrate 10. Preferably, the protruding portion of the stage 200 has a diameter d2 of a plane thereof smaller than an inner diameter d1 of the support unit 410 such that an upper part of the protruding portion can be at least partially inserted into an inner space of the support unit 410. Accordingly, if the stage 200 is lifted up by operating the first driving unit 230, the substrate 10 supported on the support unit 410 is seated on the protruding portion of the stage 200 and lifted up together, so that the substrate 10 can be positioned close to the plasma shielding unit 300.

The support unit 410 allows the substrate 10 to be supported in a space between the stage 200 and the plasma shielding unit 300 and to be moved up and down, thereby adjusting a gap between the substrate 10 and the stage 200 and a gap between the substrate 10 and the plasma shielding unit 300. The support unit 410 includes an arm portion 413 installed in the upper part of the chamber 100 to be expanded and contracted up and down, and a support portion 411 bent inward at an end of the arm portion 413 to support the edge region of the substrate 10 on a top surface thereof.

The arm portion 413 may allow the substrate 10 to be positioned inside thereof. Preferably, the arm portion 413 is formed to have a structure capable of stably supporting the load of the substrate 10, i.e., in the shape of a pair of long rods or a hollow cylinder. One end of the arm portion 413 is connected to a second driving unit 420 provided at the outside of the chamber 100 to be expanded and contracted up and down. The other end of the arm portion 413 is moved up and down between the stage 200 and the plasma shielding unit 300 by the second driving unit 420. Preferably, the support portion 411 is formed in the same shape as that of the substrate 10 to have a structure in which the edge region of the substrate 10 can be stably supported on the top surface of the support portion. For example, if the substrate 10 has a circular shape, the support portion 411 may be formed in the shape of a single ring as shown in FIG. 2, or in the shape of a plurality of segments, into which a single ring is divided, as shown in FIG. 3. At this time, the inner diameter d1 of the ring shape is preferably formed to be slightly smaller than the diameter of the substrate 10. Therefore, most of the central region of the rear of the substrate 10 except for the edge region may be exposed. Preferably, a bent portion 412 formed between the support portion 411 and the arm portion 413 is formed to be flat inward or to be inclined downwardly from the outside to the inside. Accordingly, there is an effect in that the substrate 10 is stably seated on a flat surface, or automatically aligned on the support portion 411 while being guided along the inclined surface. Preferably, the support portion 410 is configured in a floating state not to electrically interfere with other components of the apparatus for processing a substrate. To this end, the support portion 410 may be formed of an insulating material such as $Al_2O_3$.

The plasma generating unit serves to generate plasma between the stage 200 and the plasma shielding unit 300 such that the substrate 10 is plasma-processed. This embodiment is configured such that the stage 200 serves as a lower electrode, and the plasma shielding unit 300 serves as an upper electrode. At this time, the plasma shielding unit 300 is connected to the ground power source and the stage 200 is connected to a power supply unit 530 so that plasma power is applied. In this embodiment, the power supply unit 530 supplies radio frequency power to the stage 200, and an impedance matching unit 531 matches impedance between the maximum power of the radio frequency power and the load of the stage 200. However, the plasma generating unit is not limited thereto. That is, the plasma generating unit may be modified to any unit for generating plasma between the stage 200 and the plasma shielding unit 300. For example, an electrode for generating plasma may be formed in the shape of an antenna at the outside of the chamber 100, and DC power may be used instead of the radio frequency power. Alternatively, ground power may be applied to the stage 200, and high frequency power may be applied to the plasma shielding unit 300.

Meanwhile, the apparatus for processing a substrate having the aforementioned configuration allows plasma processing on not only an edge region of the substrate but also a rear region of the substrate to be individually performed in a single chamber, which will be described in detail as follows.

Figure 4:
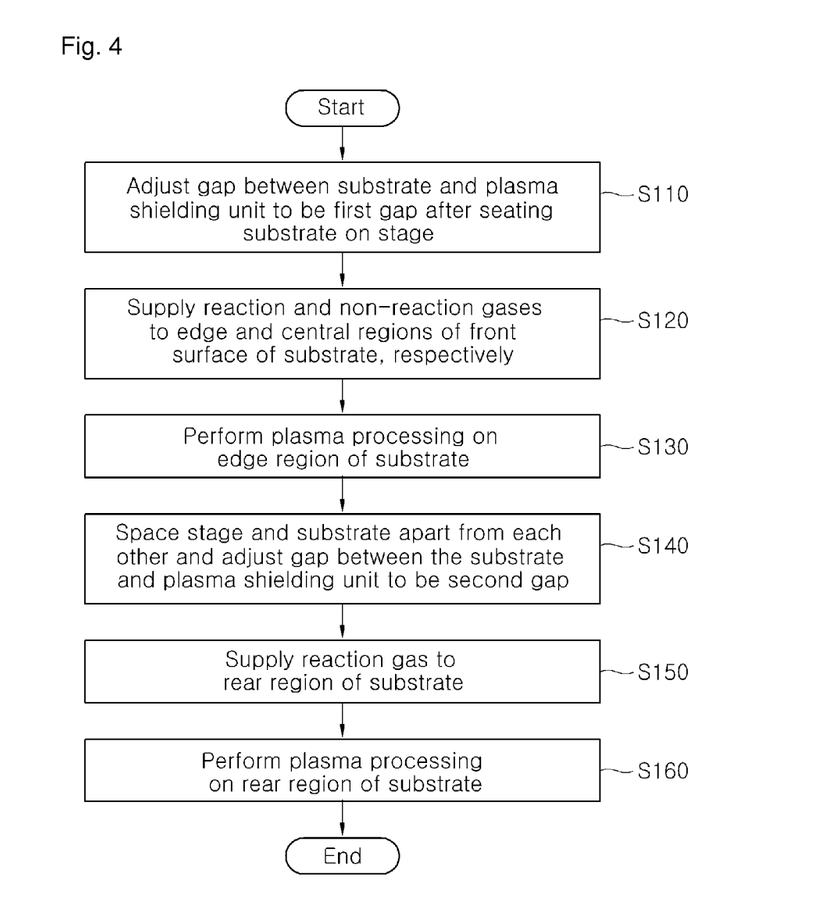
FIG. 4 is a flowchart illustrating a plasma processing method operation according to the first embodiment of the present invention.
Figure 5:
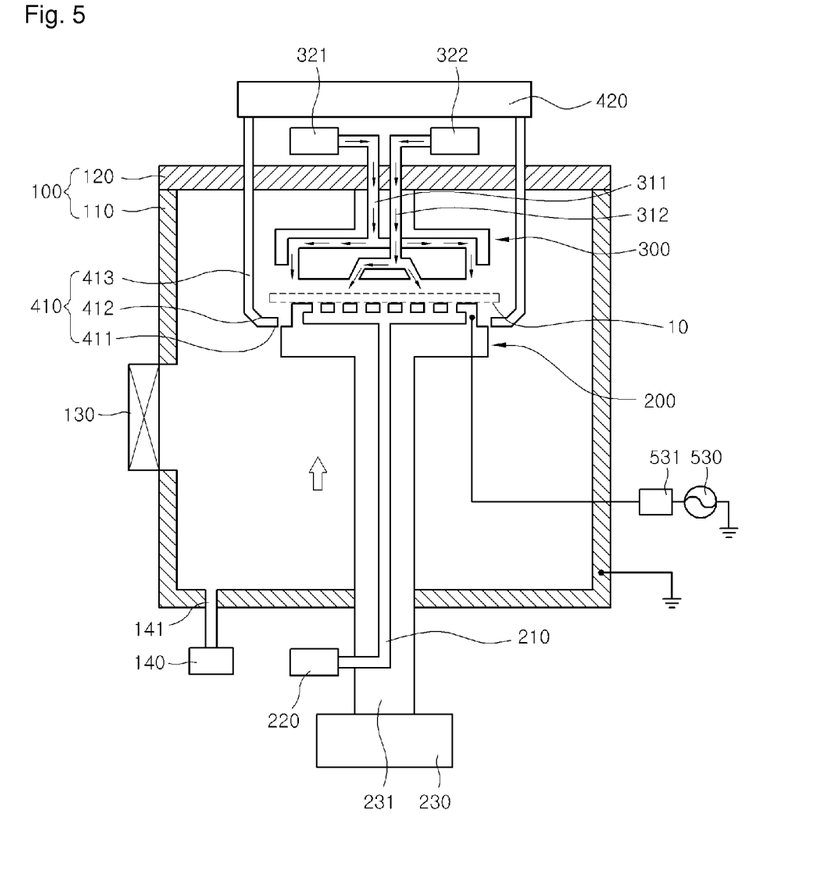
FIG. 5 is a schematic view of a chamber illustrating a primary plasma processing process according to the first embodiment of the present invention.
Figure 6:
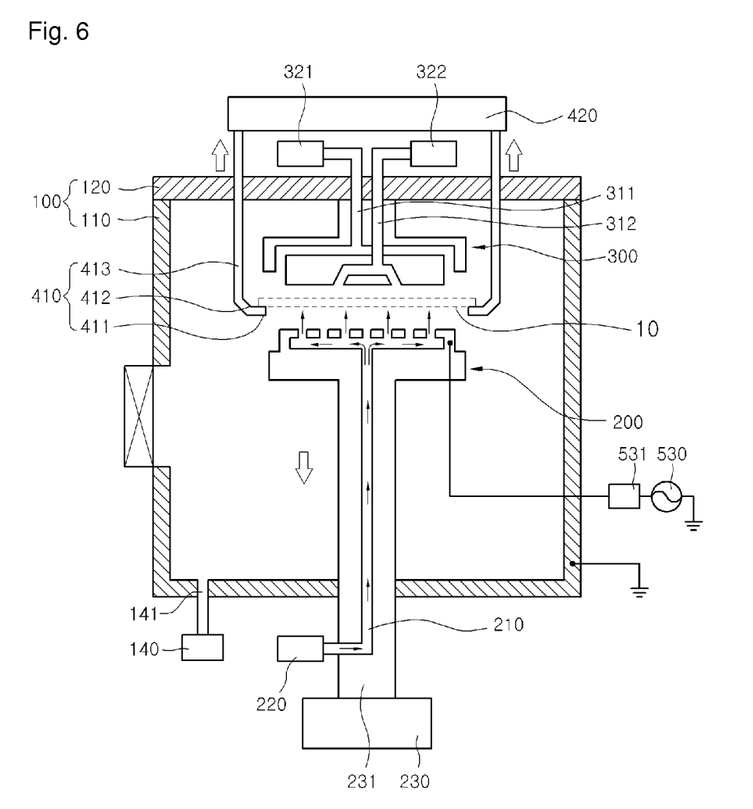
FIG. 6 is a schematic view of a chamber illustrating a secondary plasma processing process according to the first embodiment of the present invention.

FIG. 4 is a flowchart illustrating a plasma processing method operation according to the first embodiment of the present invention, FIG. 5 is a schematic view of a chamber illustrating a primary plasma processing process according to the first embodiment of the present invention, and FIG. 6 is a schematic view of a chamber illustrating a secondary plasma processing process according to the first embodiment of the present invention.

Referring to FIGS. 4 and 5, plasma processing is performed on the edge region of the substrate 10 in a primary plasma processing process. First, the substrate 10 having a predetermined thin film formed thereon is loaded into the chamber 100 to be supported on the support portion 410. Subsequently, the rear of the substrate 10 is seated on the protruding portion of the stage 200 by lifting up the stage 200, and the gap between the central region of the front of the substrate 10 and the plasma shielding unit 300 is then adjusted to be a first gap, in which plasma is not activated, i.e., in a range of 0.1 to 0.7 mm by again lifting up the stage 200 (S110). Then, a reaction gas is supplied to the edge region of the front of the substrate 10 through the second supply pipe 311, and a non-reaction gas is supplied to the central region of the front of the substrate 10 through the third supply pipe 312 (S120). Thereafter, if plasma power is applied to the stage 200, plasma is formed, so that plasma processing is performed on the surface of the substrate 10 (S130). At this time, the central region of the rear of the substrate 10 is seated on the protruding portion of the stage 200 to be sealed. A kind of shielding layer is formed in the central region of the front of the substrate 10 by the non-reaction gas supplied through the third supply pipe 311. Accordingly, in the primary plasma processing process, the central regions of the front and rear of the substrate 10 are protected, and the plasma processing is performed only on the exposed edge region of the substrate 10.

Referring to FIGS. 4 and 6, plasma processing is performed on the rear region of the substrate in a secondary plasma processing process. As the primary plasma processing is finished, the substrate 10 and the plasma shielding unit 300 are spaced apart from each other by lowering down the stage 200. Accordingly, the substrate 10 is supported on the support unit 410. Subsequently, the gap between the central region of the front of the substrate 10 and the plasma shielding unit 300 is adjusted to be a second gap, in which plasma is not activated, i.e., in a range of 0.1 to 0.7 mm by lifting up the support unit 410 (S140). Subsequently, a reaction gas is supplied to the rear of the substrate 10 through the first supply pipe 210 of the stage 200 (S150). If plasma power is applied to the stage 200, plasma is formed, so that plasma processing is performed on the rear of the substrate 10 (S160). At this time, the front region of the substrate 10 is positioned close to the plasma shielding unit 300 so that the substrate 10 is prevented from being exposed to plasma. Accordingly, in the secondary plasma processing process, the front of the substrate 10 is protected, and the plasma processing is performed only on the rear of the substrate 10.

Meanwhile, in the primary and secondary plasma processing processes, the reaction gas may include a fluorine radical or a chlorine radical. The fluorine radical includes at least one of $CF_4$, $CHF_4$, $SF_6$, $C_2F_6$, $C_4F_8$ and $NF_3$. The chlorine radical includes at least one of $BCl_3$ and $Cl_2$. In addition, various etching gases may be used for chemically etching a thin film or particles accumulated on the substrate 10. The non-reaction gas may include oxygen, hydrogen, nitrogen and inert gases. In addition, various protection gases may be used for protecting the thin film formed on the substrate 10. It will be apparent that a mixture of the reaction and non-reaction gases may be used depending on processing conditions.

Second Embodiment

The aforementioned apparatus for processing a substrate is not limited to the aforementioned configuration but may vari-ously be modified. Hereinafter, an apparatus for processing a substrate according to a second embodiment of the present invention will be described as an example of the modifications. At this time, descriptions overlapping with the aforementioned embodiment will be omitted or briefly described.

Figure 7:
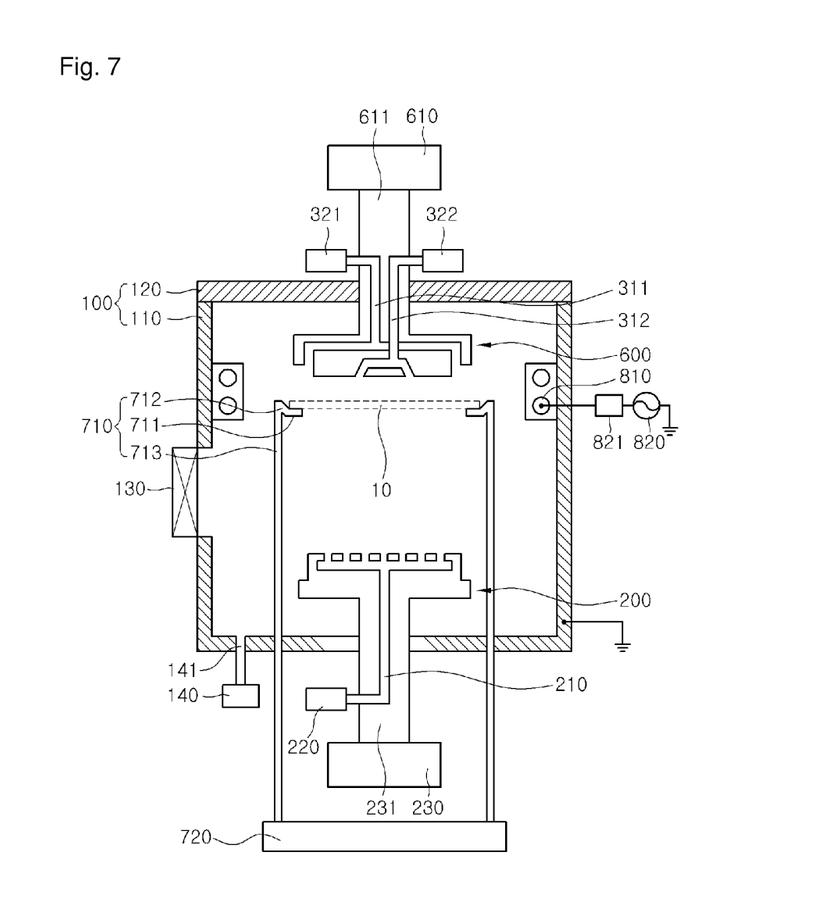
FIG. 7 is a schematic view of an apparatus for processing a substrate according to a second embodiment of the present invention.

FIG. 7 is a schematic view of an apparatus for processing a substrate according to the second embodiment of the present invention.

Referring to FIG. 7, the apparatus for processing a substrate according to this embodiment includes a chamber 100 having a reaction space provided therein; a stage 200 installed at a lower part of the interior of the chamber 100; a plasma shielding unit 600 installed at an upper part of the interior of the chamber 100 opposite to the stage 200; a support unit 710 allowing a substrate to be supported between the stage 200 and the plasma shielding unit 600; and a plasma generating unit including 810 and 820 for generating plasma between the stage 200 and the plasma shielding unit 600.

Unlike the first embodiment, the supporting unit 710 is installed at the lower part of the chamber 100, and the plasma shielding unit 600 is installed to be lifted and rotated by a driving unit. That is, the supporting unit 710 includes an arm portion 713 installed in the lower part of the chamber 100 to be expanded and contracted up and down, and a support portion 711 bent inward at an end of the arm portion 713 to support the edge region of the substrate 10 on a top surface thereof. A flat surface for seating a substrate or an inclined surface for aligning a substrate is formed at a bent portion 712 between the support portion 711 and the arm portion 713. One end of the arm portion 713 is connected to a second driving unit 720 provided at the outside of the chamber 100 to be expanded and contracted up and down. The other end of the arm portion 713 is moved up and down between the stage 200 and the plasma shielding unit 600 by the second driving unit 720. An upper side of a body of the plasma shielding portion 600 is coupled to one end of a drive shaft 611, and the other end of the drive shaft 611 passes through the top wall of the chamber 100 and then is coupled to a third driving unit 610 for applying lifting and rotary forces to the drive shaft 611. Therefore, a gap between the stage 200 and the substrate 10 or between the substrate 10 and the plasma shielding unit 600 is freely adjusted not only by lifting the support unit 710 but also by lifting the stage 200 or the plasma shielding unit 600, whereby processing conditions can be easily controlled.

The plasma generating unit including 810 and 820 includes a plasma electrode 810 provided at an outer region of the support unit 710 and a power supply unit 820 for supplying plasma power to the plasma electrode 810. In this embodiment, the power supply unit 820 supplies radio frequency power to the plasma electrode 810, and an impedance matching unit 821 matches impedance between the maximum power of the radio frequency power and the load of the plasma electrode 810. The plasma electrode 810 is formed in a flat and ring shape corresponding to the shape of the substrate 10, so that plasma having a dense distribution can be generated in the edge region of the substrate 10. Accordingly, plasma processing can be effectively performed on the edge region of the substrate 10.

Meanwhile, although an apparatus for processing a substrate using plasma for thin film etching has been described in the first and second embodiments, the present invention is not limited thereto. That is, an apparatus for processing a substrate according to the present invention can also be used in various processes using plasma, e.g., a thin film deposition process, a thin film cleansing process and the like.

Although the present invention has been described in connection with the preferred embodiments and the accompanying drawings, the present invention is not limited thereto but defined by the appended claims. Accordingly, it will be understood by those skilled in the art that various modifications and changes can be made thereto without departing from the spirit and scope of the invention defined by the appended claims.

INDUSTRIAL APPLICABILITY

In the present invention, plasma processing is individually performed on each of edge and rear regions of the substrate in a single chamber. Accordingly, an installation space for the apparatus is reduced, so that the space utility of production lines can be improved. Further, since there is no exposure of the substrate the atmosphere due to the movement of the substrate between chambers, the substrate is less contaminated. Also, since there is no standby time due to the movement of the substrate between the chambers, the entire processing time can be reduced.

The invention claimed is:

1. An apparatus for processing a substrate, comprising:
   a chamber providing a reaction space;
   a stage installed in the chamber;
   a plasma shielding unit installed opposite to the stage in the chamber;
   a support unit for supporting a substrate between the stage and the plasma shielding unit;
   a first supply pipe provided at the stage to supply a reaction or non-reaction gas to one surface of the substrate; and
   second and third supply pipes provided at the plasma shielding unit, the second supply pipe supplying a reaction gas to the other surface of the substrate, the third supply pipe supplying a non-reaction gas to the other surface,
   wherein the support unit comprises an arm portion configured to expand and contract in the chamber; and a support portion bent inwardly at an end of the arm portion to support an edge region of the substrate on a top surface thereof,
   wherein the support portion is configured to be in a floating state spaced apart from the stage not to electrically interfere with other components, and
   wherein a bent portion of the support portion is inclined.

2. The apparatus as claimed in claim 1, further comprising a driving unit for lifting at least one of the stage and the plasma shielding unit.

3. The apparatus as claimed in claim 1, wherein at least one of the stage and the plasma shielding unit has a protruding portion that protrudes toward the substrate.

4. The apparatus as claimed in claim 3, wherein the protruding portion is formed so that a planar area of the protruding portion is smaller than that of the substrate.

5. The apparatus as claimed in claim 3, wherein the protruding portion is formed so that a planar diameter of the protruding portion is smaller than an inner diameter of the support unit.

6. The apparatus as claimed in claim 1, wherein the arm portion is installed to an upper or lower side of the chamber.

7. The apparatus as claimed in claim 1, wherein the support portion is formed in the shape of a single ring, or in the shape of a plurality of segments that are arranged in the shape of a single ring.

8. The apparatus as claimed in claim 1, wherein the reaction gas is supplied to an edge region of the substrate through the second supply pipe, and the non-reaction gas is supplied to a central region of the substrate through the third supply pipe.

9. The apparatus as claimed in claim 1, wherein the support unit is configured to adjust a distance between the substrate and the plasma shielding unit.

* * * * *